(12) United States Patent
Roy et al.

(10) Patent No.: US 6,388,495 B1
(45) Date of Patent: May 14, 2002

(54) DYNAMIC TERMINATION AND CLAMPING CIRCUIT

(75) Inventors: Aninda Roy, San Jose; Gajendra P. Singh, Sunnyvale, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/791,337

(22) Filed: Feb. 23, 2001

(51) Int. Cl.[7] .............................. H03K 5/08; H03L 5/00
(52) U.S. Cl. ..................... 327/309; 327/112; 327/543; 326/30; 326/86
(58) Field of Search ................................ 327/112, 108, 327/530, 538, 540–543, 309, 318, 321, 324, 379, 310, 391, 427, 434, 437; 376/30, 83, 86, 87

(56) References Cited

U.S. PATENT DOCUMENTS

| 4,663,584 A | * | 5/1987 | Okada et al. | 327/537 |
|---|---|---|---|---|
| 5,187,386 A | * | 2/1993 | Chang et al. | 327/437 |
| 5,206,544 A | * | 4/1993 | Chen et al. | 326/30 |
| 5,532,616 A | * | 7/1996 | Keeney | 326/30 |
| 5,546,016 A | * | 8/1996 | Allen | 326/30 |
| 5,973,544 A | * | 10/1999 | Ohno | 327/530 |
| 6,060,938 A | | 5/2000 | Morrill | 327/391 |
| 6,100,713 A | | 8/2000 | Kalb et al. | 326/30 |

\* cited by examiner

*Primary Examiner*—Terry D. Cunningham
*Assistant Examiner*—Long Nguyen
(74) *Attorney, Agent, or Firm*—SKjerven Morrill MacPherson LLP (57) ABSTRACT

The present invention is directed to an apparatus and method to clamp and terminate signals along a communication bus; the clamping and termination are performed dynamically whenever a signal exceeds a set peak value or falls below a set low value. Variations include a clamping and termination circuit made of metal oxide semiconductor (MOS) devices where one MOS device clamps for over-voltage and another MOS device clamps for under-voltage. Biasing circuits to the gates of the MOS devices assure that proper bias voltage is applied so that the MOS devices only clamp and terminate when a signal is received and that signal falls off the set high or low values, this assures dynamic clamping and termination and avoids unnecessary additional voltage from a driving device.

12 Claims, 7 Drawing Sheets

DYNAMIC TERMINATION AND CLAMPING CIRCUIT

BACKGROUND OF THE INVENTION

1. Field of the Invention

This invention relates to a terminating and clamping circuit, and more particularly to a terminating and clamping circuit used in a transmission bus in a computing system.

2. Description of the Related Art

Communication systems, in particular computing systems, and their devices communicate in a binary language of voltage waveform signals (wave) that translate to either a "1" or a "0." A wave that represents a "1" has a predetermined maximum peak voltage and a predetermined minimum voltage. A wave that represents a "0" has a predetermined maximum peak voltage that is considerably lower than a wave representing a "1" or the wave may have no value (a flat wave with a zero voltage value) and a predetermined minimum voltage. In complementary metal oxide semi-conductor (CMOS) circuits, the peak of a wave representing a "1" is the voltage value $V_{DD}$ (the "high" value). A peak of a wave representing a "0" is the voltage value $V_{SS}$ (the "low" value). Typical applications set the high value at some positive voltage, for example 1.2 volts, and the low value is set to zero volts.

In a communication system a device can be a driver device transmitting the signals; a device can be a receiver device accepting and computing the signal; or the device may act as both a transmitter and a receiver device. A communication system may be a circuit and the transmission bus can be an electrical trace line capable of carrying the signals. The receiver determines what the minimum value of the peak voltage is that represents "1" and the maximum value of the peak voltage that represents "0."

As a wave is launched from the driver device it travels along the bus until the receiver device receives the wave. The transmitted incident wave may be totally absorbed, totally reflected, or some combination between absorbed and reflected. After a propagation delay, a wave can be reflected back along the bus. Any reflection of a wave that travels back along the bus leads to noise that affects subsequent transmitted waves. When a driver device sends an initial wave, this wave may be reflected back from the receiver device. A reflected wave adds to the value the incident wave and of subsequent wave(s) sent from the driver device thus exceeding the voltage high reference value $V_{DD}$. In other instances, reflected waves may cancel out a subsequent transmitted wave or waves.

The described problem with reflected waves is known as inter-symbol interference (ISI) and leads to noise and erroneous transmission along the bus. Reflected waves eventually settle and the noise is eliminated, however, when transmitting waves at a greater rate than settling allows, waiting for settling of reflected waves is not acceptable. In a computing system where the electrical trace line (bus) is about three inches long, a transmitted wave that is reflected may take about 10 to 20 nanoseconds to oscillate and settle. When transmitting signals at the rate of 250 Mhz, there is insufficient time to wait for a reflected wave to settle. Therefore in many devices the incident wave is made to be large enough so that the receiver senses the value transmitted without the need of the reflection to settle down. This method of transmission is called incident switching.

In typical applications, a trace line or bus connects one device to another device. In these point to point transmissions, reflected waves and noise can be addressed by clamping and terminating circuits that clamp a transmitted wave to the set high and low wave parameters and terminate a received wave.

A driver launches a large enough wave to ensure incident switching to offset subsequent reflection and noise problems. The transmitted wave is reflected at the receiver per the following equation:

$$V_R = V_I \times [Z_{term} - Z_{trans}] / [Z_{term} + Z_{trans}]$$

$V_R$ represents a reflected wave. $V_I$ represents an incident wave or received wave. $Z_{term}$ is the impedance of the termination device or circuit. $Z_{tran}$ is impedance along the transmission bus. If there is no termination, the impedance value at the termination end being zero, the reflected wave is equal to the incident wave (absolute value) and there is complete reflection. A completely reflected wave therefore requires a large enough wave to be launched (transmitted) that would offset the reflected wave. In addition the wave must be large enough to convey the peak voltage value. Therefore the actual transmitted wave is set to a large enough value. This, however, causes unneeded overshoots and undershoots at the receiver.

An additional physical limitation is encountered in transmitting waves as described in the proceeding. In transmitting a wave, the voltage waveform $V_T$, follows the equation:

$$V_T = V_{DD} \times [Z_{tran} / (Z_{driver} + Z_{tran})]$$

where $V_{DD}$ is the voltage reference high value, $Z_{driver}$ is the impedance at the driver device, and $Z_{tran}$ is the impedance along the transmission line. To vary the size or voltage value of the transmitted waveform, the impedance values of the transmission line or the driver device must be changed, however, the value of the transmitted waveform can never be greater than $V_{DD}$.

Figure 1:
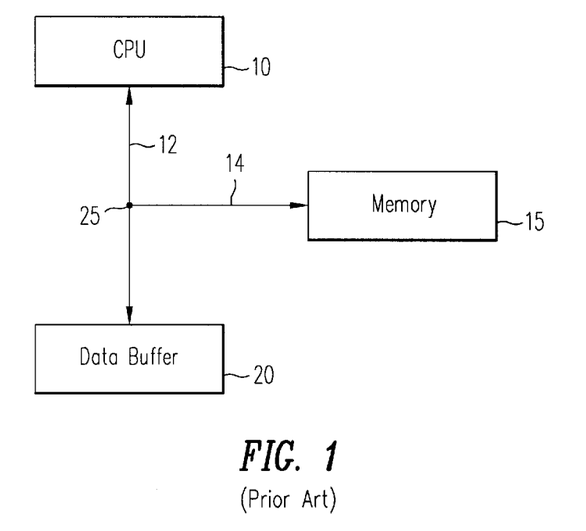
FIG. 1 illustrates a split or "T" shape transmission bus that connects a CPU, a memory, and a data buffer.

Addressing ISI and noise problems become a greater problem in a communication system with three devices. Now referring to FIG. 1, illustrated is a system where three devices are connected: a CPU 10, a data buffer 20, and a memory 15. CPU 10 is a driver and receiver device. Likewise, data buffer 20 and memory 15 also are devices capable of driving and receiving signals (waves). When one device drives a signal, the other two devices act as receivers of that signal. CPU 10 is connected to the data buffer 20 by a main bus 25. A split or spur bus 14 from main bus 25 connects memory 15 to the CPU 10 and data buffer 20.

The system illustrated in FIG. 1 can reside as a module in a computer server system. A number of modules can be contained in the computer server system. As illustrated in FIG. 1 each module consists of a central processing unit (CPU) 10, a data buffer 20, and memory 15, the memory 15 being a static random access memory device (SRAM). Each of the three devices acts as a driver or a receiver, being able to send or receive signals along the transmission busses or trace lines that connect the three devices. In one application the SRAM or memory 15 is linked to the main bus 25 by a relatively short spur bus 14. The spur bus 14 can be $\frac{1}{10}^{th}$ the length of the main bus 25. Transmission speeds along the main bus 25 and the spur bus 14 approach about 250 Mhz. It has been found that along the transmission bus, overshoots and undershoots at the data buffer are seen. An overshoot being a signal exceeding the voltage tolerance of the reference high $V_{DD}$ or exceeding the voltage tolerance of the reference low signal $V_{SS}$. An undershoot is a voltage signal falling below the tolerance values set by $V_{DD}$ or $V_{SS}$. Overshoots and undershoots may be compensated for by CPU 10 adjusting for the voltage signals as seen by the data buffer 20. Since a third device, the memory 15, also receives the signal along a much shorter transmission line, any adjustments made to compensate for the data buffer 20 adversely affects signals received at the memory 15.

Along the transmission busses waves (signals) can be reflected or absorbed. These signals may be under or over terminated. An under-terminated signal is a reflected signal. An over-terminated signal is a signal that has been compensated to the point that the it has been degraded. Under-terminated or non-terminated bus lines require a larger power output from the driver unit. Since the voltage signal remains the same, current must increase, which leads to an increased rate of current consumption in the driver unit. Proper signal termination is required to prevent reflections and noise along the busses.

In transmitting a waveform along a transmission bus, there is some propagation delay. The propagation delay depends on the length of the transmission line. A wave on integrated circuit trace line, the trace line being the bus, typically takes 180 picoseconds to travel an inch. For a three inch trace line, it takes about 540 picoseconds to a transmitted wave to go from a driver device to a receiver device. Along the spur bus 14 that is $1/10^{th}$ the length of the main bus 25, the transmitted wave takes a much shorter time to travel.

Signal propagation delay adds to the ISI and noise problem. A driver device, such as the CPU may act as a termination device and terminate the reflected wave. When a split bus is used it becomes even more necessary to clamp and terminate waves. Along with ISI, transmission problems arise with wave propagation delay, transmission timing, and other problems associated with transmitting waves. A signal cannot be clamped and terminated until it is actually received. A dynamic or active termination and clamping circuit therefore is needed at a receiving device to prevent reflections and noise along a bus.

In order to limit overshoots and undershoots of voltages transmitted as signals, clamping circuit devices have been created. These clamping devices typically have one stage that clamps the upper reference voltage signal, and a lower stage that clamps the lower reference voltage signal.

Figure 2:
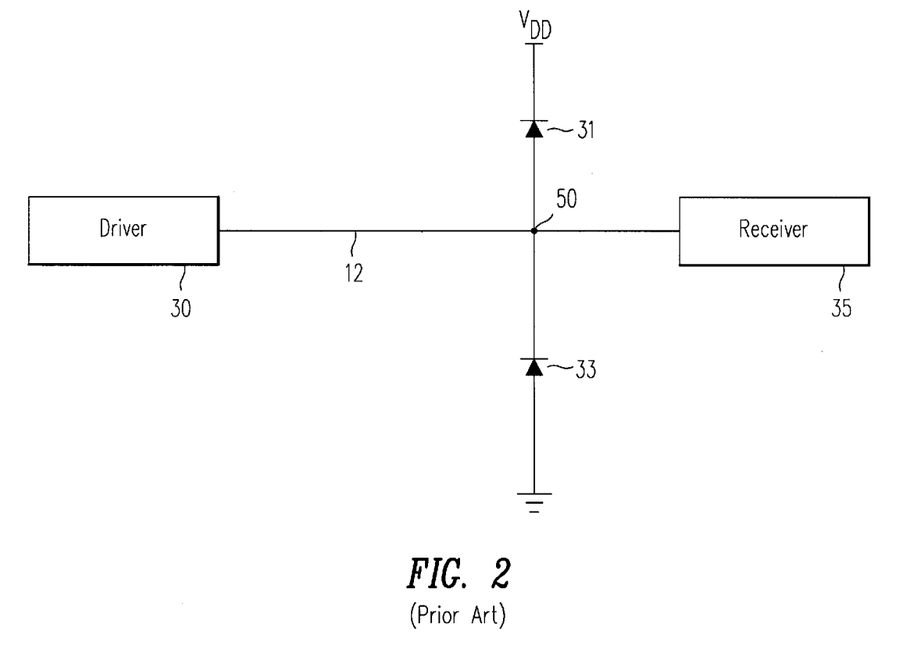
FIG. 2 illustrates a diode clamping circuit.

Now referring to FIG. 2, illustrated is a diode clamping circuit. A transmission bus 12 connects a driver device 30 to a receiver device 35. Along the transmission bus 12 an input/output pad 50 connects diode 31 and diode 33. Diode 31 prevents swings greater than $V_{DD}$, and diode 33 prevents voltage swings greater below $V_{SS}$. In other words, diode 31 conducts when the voltage swings greater than $V_{DD}$ and diode 33 conducts when the voltage swings below $V_{DD}$. Diode clamps have the advantage that they are able to clamp only when a signal is received, acting as "active" clamps. Constant clamping circuits on the other hand continuously clamp and can act against transmitted signals forcing a driver device to output unneeded voltage. Diode clamps, however, have their disadvantages. One disadvantage is that a diode to be activated requires reaching a threshold voltage for the diode. This threshold voltage must be reached prior to the diode being able to terminate the voltage signals. In transmitting signals at the rate of 250 MHz, the wait to reach threshold voltage is insufficient for transmission. Diodes are inadequate because they have a bias voltage that must be met along with the sinking voltage that for example may add up to about 1.1 volts before they are effective. In transmitting waveform signals that have 1.2 voltages, diode clamps are ineffective in clamping to high and low signals. Considering the need to reach a threshold voltage, a diode clamp is not fast enough to address the clamping concerns of a high speed transmission bus that may transmit signals at the rate of 250 Mhz. A voltage source may be added that continuously supplies a threshold voltage, however, this presents additional costs and design consideration for a quality voltage source just to provide the threshold voltage to the diode.

Figure 3:
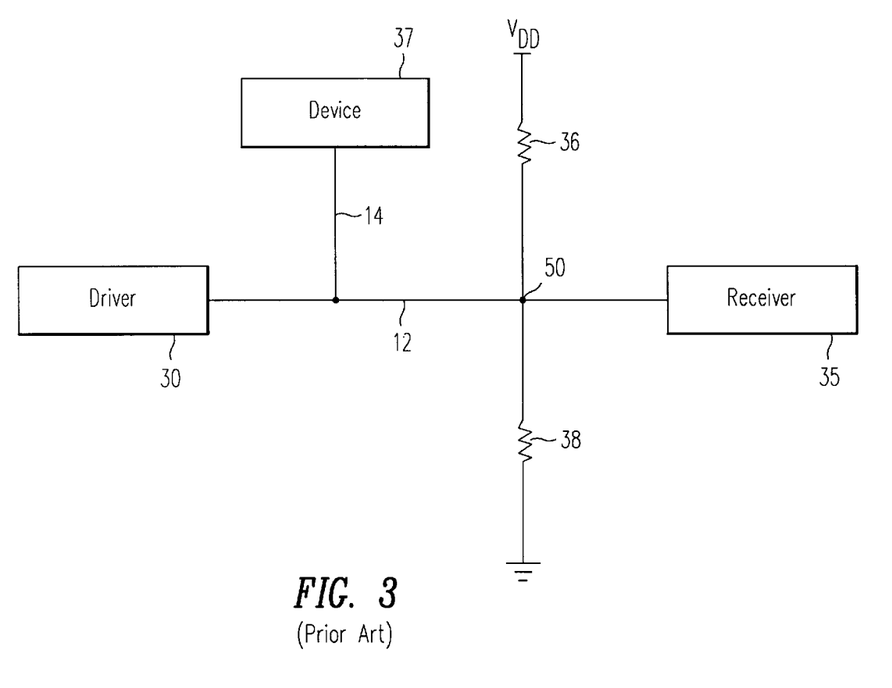
FIG. 3 illustrates a resistor clamping circuit.

Now referring to FIG. 3, a resistor clamping circuit is illustrated. A resistor 36 clamps for over-voltage situations, while resistor 38 clamps for under-voltage situations. Resistors 36 and 38 are connected along transmission bus 12 by input/output pad 50. Unlike a diode clamp that only activates upon when a signal is received, the resistor clamp continuously clips the waves (clips the transmitted voltage). The resistor clamp effectively is fighting the driver device 30 and lowering the voltage, therefore the driver device 30 to properly transmit a signal to the receiver device 35, a large enough signal must be transmitted. Adding a third device 37 connected by a spur bus 14 complicates the situation. As the receiver device 35 receives signals from the driver device 30, the clamping circuit clips and the driver device 30 adjusts its transmission to assure proper transmission to the receiver device 35. The by-product of the voltage adjustment is an improper transmission to the third device 37.

Figure 4:
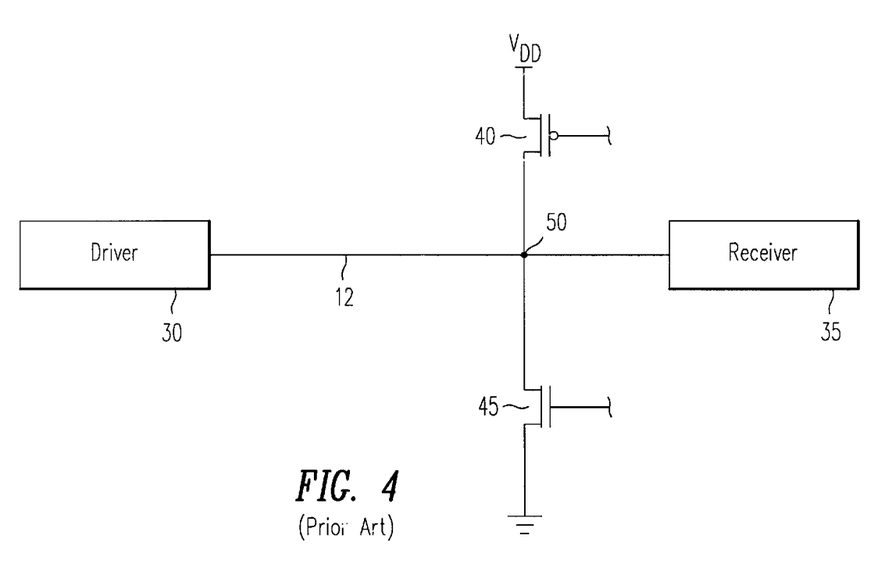
FIG. 4 illustrates a CMOS clamping circuit.

Now referring to FIG. 4, illustrated is a CMOS clamping circuit. A driver device 30 transmits signals to receiver device 35 along transmission bus 12. CMOS device 40, which in this embodiment is a PMOS type device, clips the signal voltage if it exceeds $V_{DD}$. CMOS device 45, which in this embodiment is an NMOS type device, clips the voltage signal if it drops below $V_{SS}$. CMOS devices can provide the necessary active clamping needed in a high transmission computer systems. CMOS clamping circuits, however, can act as resistor clamping circuits, if they are not properly biased. Like resistor clamping circuits, CMOS devices, however, can act like resistor clamps and continuously clamp and clip a signal. The clamping continuously occurs even when a received waveform is within the tolerable values, unnecessarily clipping the received waveform.

Figure 5:
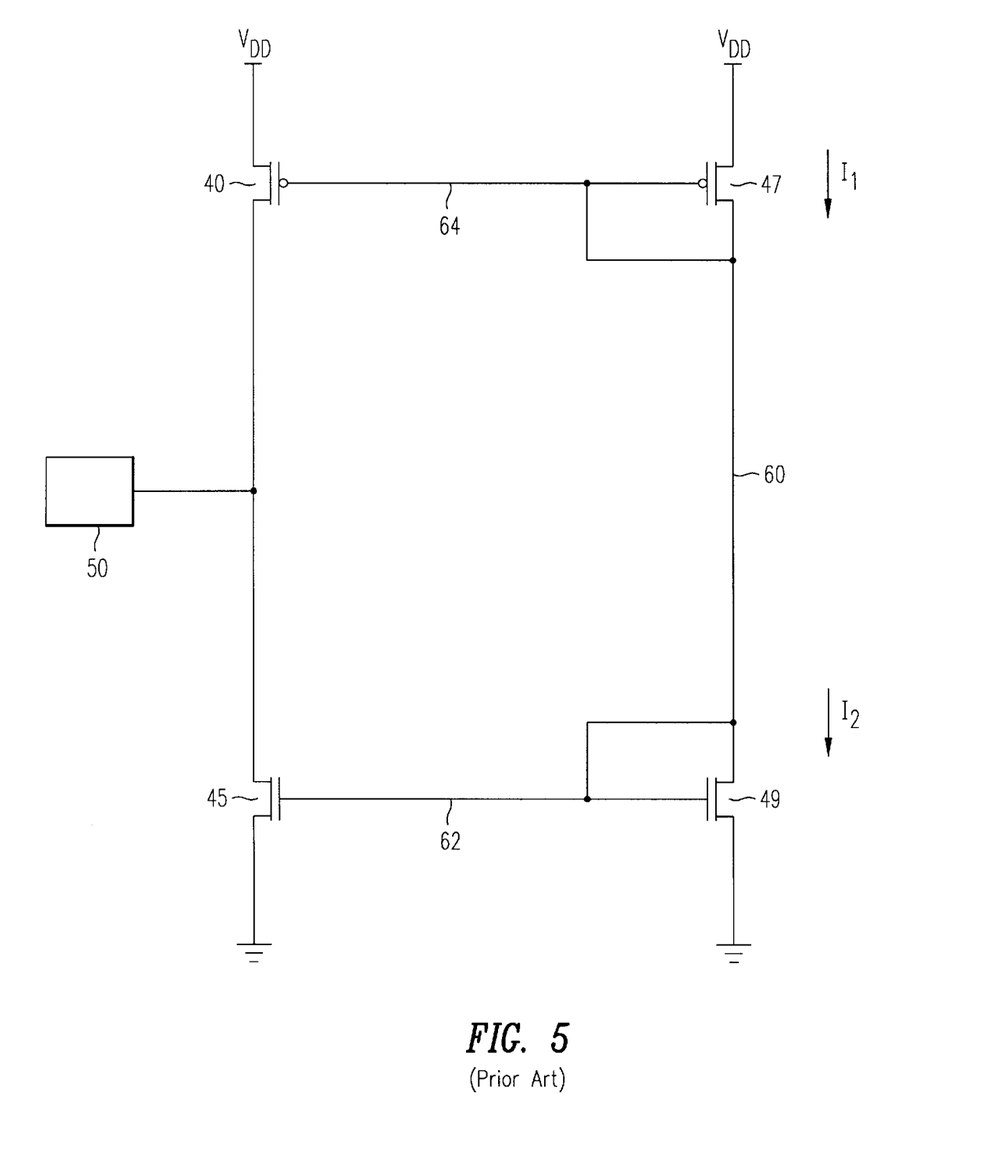
FIG. 5 illustrates a CMOS clamping circuit with a voltage biasing.

Now referring to FIG. 5, illustrated is a CMOS clamping circuit with a biasing circuit. This CMOS clamping has an upper stage CMOS device 40 that clips the signal voltage if it exceeds $V_{DD}$. CMOS device 45 clips the voltage signal if it drops below $V_{SS}$. Both CMOS device 40 and CMOS device 45 are connected to a transmission bus at input/output pad 50. The gate of CMOS device 40 is connected to the gate of CMOS device 47 which in turn connects to the source of CMOS device 47. The gate of CMOS device 45 is connected to the gate of CMOS device 49 which in turn connects to the drain of CMOS device 49. This particular CMOS clamping circuit uses the CMOS device 47 and CMOS device 49 in the described configuration in order to attain voltage biasing, voltage biasing is needed in order to have an active clamping circuit.

In a CMOS clamping circuit, bias voltage for the CMOS upper and lower stages must be constant for active clamping to take place. If the bias voltages are not steady, there is no clamping of the bus or the clamping is ineffective. The bias voltage at node 64 is $V_{DD}-V_{TP}$. The bias voltage at node 62 is $V_{TN}$.

In the CMOS clamping circuit of FIG. 5, a feedback setup to maintain constant current in the biasing circuits is necessary. The current value at node 60 must be maintained in order for the biasing to properly function. A feedback setup must be incorporated to adjust impedance to maintain the constant current at node 60. It is found that a voltage drop occurs, the voltage drop being $V_{DD}-V_{TP}-V_{TN}$ across CMOS device 47 to CMOS device 49. To maintain the constant current at node 60, impedance must be adjusted.

Further, although this CMOS clamp provides DC termination, it is ineffective for AC termination.

A need has been felt for a dynamic termination and clamping circuit which reduces noise by actively detecting when overshoots and undershoots occur at the receiver and on detection of an overshoot/undershoot clamps the bus at the rail voltages (reference voltages $V_{SS}$ and $V_{DD}$), thus providing dynamic termination to the bus. A need is felt for a circuit to allow improved signal integrity at the receiver without sacrificing the speed of the network and noise-margins at the receiver. Further a properly biased active clamping and terminating circuit must be able to operate at all process voltage and temperature (PVT) corners or conditions.

SUMMARY OF THE INVENTION

In a communication system that connects transmitters and receivers along a transmission or communication bus, there are reflections leading to overshoots and undershoots which in turn lead to ISI noise; a dynamic clamping and termination circuit provides clamping of the voltage and under voltage waves and also terminates the signal in order to reduce ISI noise.

In one embodiment of the invention a MOS based clamping and termination circuit is used. One MOS transistor clamps to a set over voltage value and another MOS transistor clamps to a set under voltage value. Bias voltages are provided in order for the MOS devices to actively or dynamically clamp when a signal is received.

In a specific embodiment of the invention MOS stage circuits are used a leaker devices to regulate biasing. In the same embodiment, MOS devices are connected to act as capacitors to allow stabilization of the bias voltages.

Another embodiment includes a method for clamping and biasing the clamping stages in order to actively clamp and terminate signals along the communication bus.

One embodiment makes use of a feedback system incorporating operational amplifiers which provide biasing voltages to MOS devices which provide clamping for the under voltage and over voltage signals.

BRIEF DESCRIPTION OF THE DRAWINGS

The present invention may be better understood, and its numerous objects, features and advantages made apparent to those skilled in the art by referencing the accompanying drawings. The use of the same reference number throughout the figures designates a like or similar element.

While the invention is susceptible to various modifications and alternative forms, specific embodiments thereof are shown by way of example in the drawings and will herein be described in detail, it should be understood, however, that the drawings and detailed description thereto are not intended to limit the invention to the particular form disclosed but on the contrary, the intention is to cover all modifications, equivalents, and alternatives falling within the spirit and scope of the present invention as defined by the appended claims.

DETAILED DESCRIPTION

Figure 6:
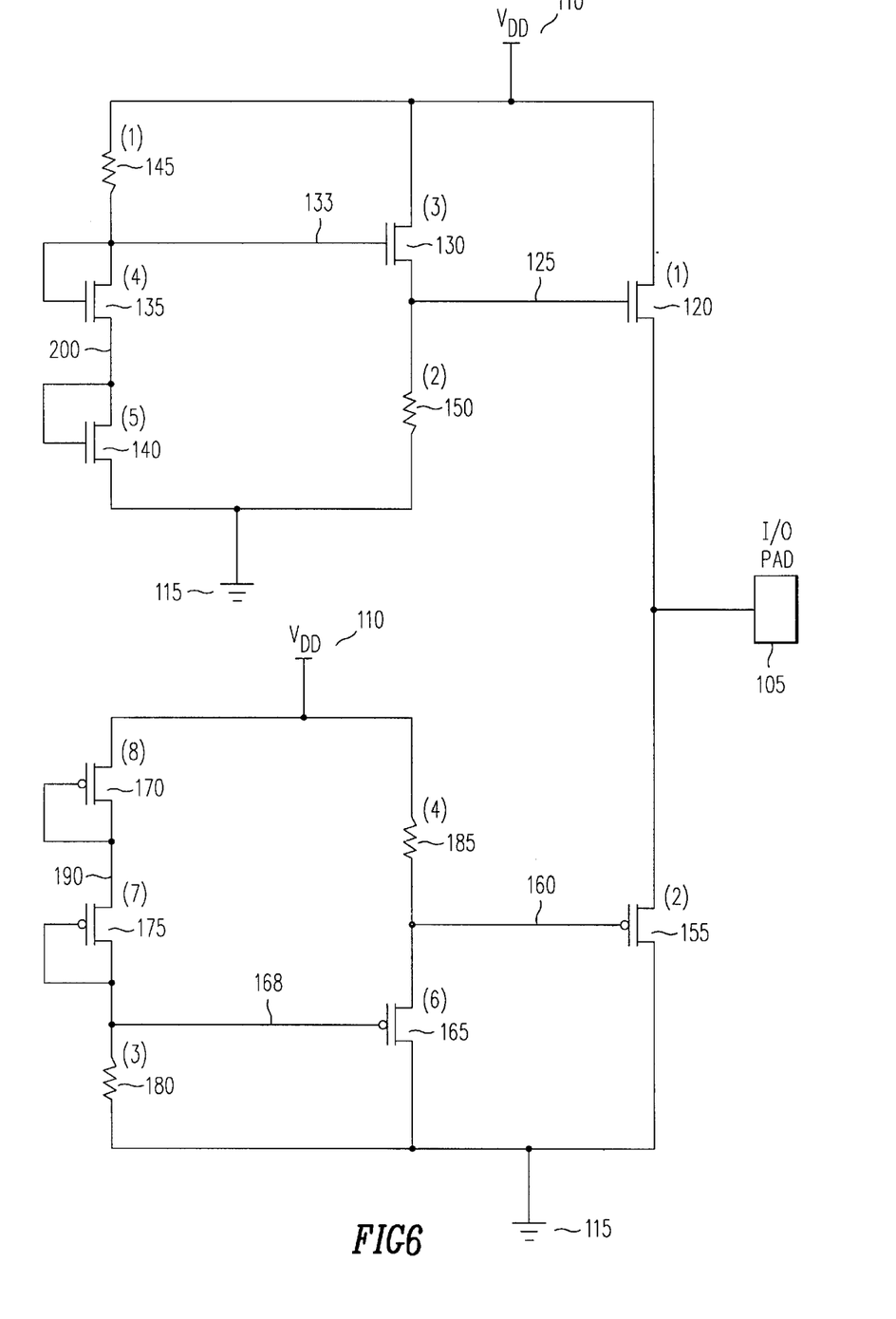
FIG. 6 illustrates a biasing sub-circuit of a clamping and termination circuit.

Now referring to FIG. 6, illustrated is a dynamic clamping and termination circuit that has bias voltages that are maintained by a biasing circuit. This embodiment of the circuit may be part of a larger integrated circuit (IC) chip such as a computer system as illustrated in FIG. 1. An input/output pad 105 connects the clamping circuit of FIG. 6 to a communication bus. Referring back to FIG. 1, pad 105 can be connected along bus 25 before data buffer 20.

The circuit of FIG. 6 clamps voltage at the pad 105 to the reference rail voltages $V_{DD}$ and $V_{SS}$. $V_{DD}$ is the drain voltage and $V_{SS}$ is the source supply voltage of the respective CMOS devices.

The clamping and termination circuit prevents the voltage of the pad 105 from overshooting the $V_{DD}$ voltage 110 or undershooting the $V_{SS}$ voltage 115 which is ground or zero volts. If $V_{DD}$ voltage 110 is 1.9 volts and $V_{SS}$ voltage 115 is 0 volts, the clamp circuit prevents the pad 105 voltage from going above 1.9 volts or below 0 volts.

The pad 105 voltage is clamped to the $V_{SS}$ voltage 115 by NMOS device 120. The gate 125 of NMOS 120 is biased to the turn-on gate threshold voltage $V_{TN}$ of NMOS 120. The value of $V_{TN}$ is one NMOS threshold voltage. Bias voltage is generated by the bias circuit consisting of NMOS devices 130, 135, 140, and resistor 145.

This leads to a state where the gate 125 of NMOS 120 is biased to voltage value of $V_{TN}$. When the pad 105 undershoots the $V_{SS}$ voltage 115, NMOS 120 obtains a gate-source voltage of more than its threshold and turns on. Once NMOS 120 turns on, it starts sinking current from the pad 105 and clamps the pad 105 voltage to $V_{SS}$ voltage 115. The bias circuit generates the $V_{TN}$ bias voltage, by first generating the voltage equal to $2V_{TN}$, at node 133, using connected NMOS devices 135 and 140, as connected NMOS devices 135 and 140 act as a diode. Voltage value at node 133 is $2V_{TN}$. This voltage is dropped to the bias voltage $V_{TN}$ at node 125 by the NMOS source follower NMOS 130. Resistors 150 and 145 serve as leaker devices, resistor 150 for device 130, resistor 145 for devices 135 and 140.

Voltage at pad 105 is clamped to the $V_{DD}$ voltage 110 by PMOS device 155. The gate 160 of PMOS device 155 is biased to the $V_{DD}-V_{TP}$, the value of which is one PMOS voltage drop below $V_{DD}$ voltage 110. The bias voltage is generated by the bias threshold voltage drop below $V_{DD}$ voltage 110. The bias voltage is generated by the bias circuit consisting of PMOS devices 165, 170, and 175 and resistor 180. Thus the gate 160 of PMOS device 155 is biased to the value of $V_{DD}-V_{TP}$. When the pad 105 voltage overshoots the $V_{DD}$ voltage, PMOS device 155 obtains a gate-source voltage of more than its threshold and turns on. Once PMOS device 155 turns on it starts sinking current from the pad 105, thus clamping the pad 105 voltage to $V_{DD}$. The bias circuit generates the $V_{TP}$ bias voltage, by first generating the voltage equal to $V_{DD}-2V_{TP}$, at node 168, using the diode connected PMOS devices 170 and 175. This voltage then is dropped to the bias voltage $V_{DD}-V_{TP}$, at node 160, by the PMOS source-follower device 165.

Source-follower devices 165 and 130 provide voltage reference and current source as needed. Resistors 185 and 180 are current limiters, serving as leaker devices, resistor 185 for device 165 and resistor 145 for devices 170 and 175.

If the bias voltage, $V_{DD}-V_{TP}$, is not maintained, clamping occurs not at $V_{DD}$, but at a voltage much higher than $V_{DD}$. This is a problem seen with CMOS and similar type transistor voltage clamps that do not have proper voltage biasing.

Figure 7:
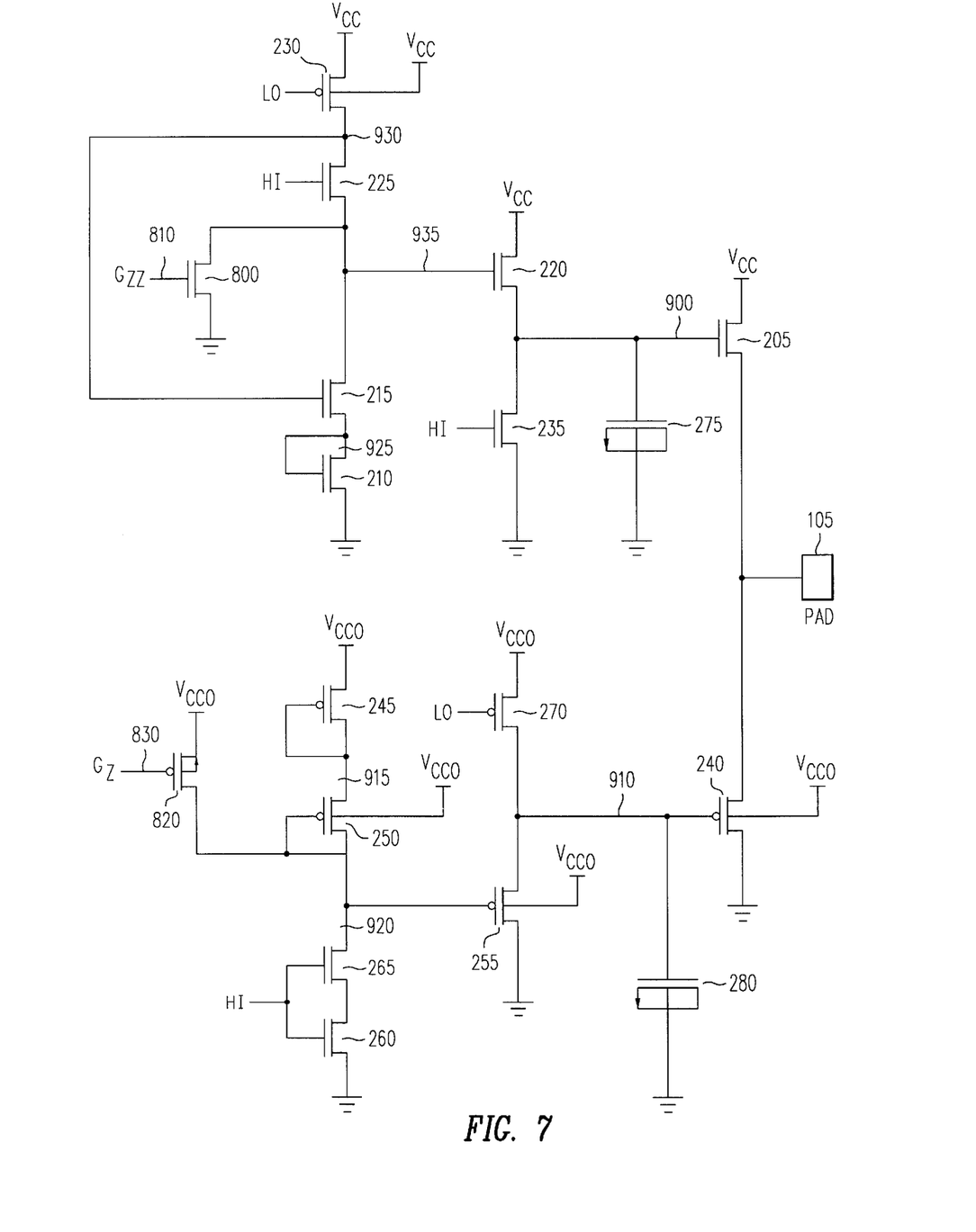
FIG. 7 illustrates a detailed embodiment of a clamping and termination circuit.

Now referring to FIG. 7 illustrated is an embodiment of a dynamic clamping and terminating circuit that includes specific modifications. NMOS device 205 provides the clamping on the undershoot. NMOS device 205 is connected to the bus at input/output pad 105. NMOS device 205 turns on and starts sinking current, clamping the bus-voltage to close at $V_{SS}$. The bias voltage of NMOS device 205 is obtained through a two-stage circuit, first by going two threshold voltages up from $V_{SS}$ using the connected MOS devices 210 and 215; MOS devices 210 and 215 behave like a diode. The bias voltage is further reduced by the source follower CMOS device 220.

CMOS device 235 is a source follower NMOS device to CMOS device 205. CMOS device 210 establishes the value $V_{TN}$ at node 925, and CMOS device 215 establishes the value $2V_{TN}$ at node 930. At node 935, the actual voltage is $2V_{TN}-\Delta voltage$, where $\Delta voltage$ is the IR (voltage) drop from CMOS device 225. PMOS device 230 acts as a leaker device that keeps on NMOS device 225, NMOS device 215.

NMOS device 225 provides a small drop from the threshold biasing NMOS device 205 at a voltage slightly less than threshold, which provides a reduction of the steady-state leakage current.

PMOS device 240 provides the clamping action when the bus overshoots, thus the source of PMOS device 240 is connected to the bus. PMOS device 240 is biased at a threshold below $V_{DD}$. Thus when the bus overshoots, in other words when the voltage at the bus goes above $V_{DD}$, PMOS device 240 turns on and begins sinking current. The bus is therefore clamped to $V_{DD}$ on overshoot.

PMOS device 240 obtains its biased voltage through two stages, first by going two thresholds below $V_{DD}$, using diode connected PMOS devices 245 and 250, and then a threshold below $V_{DD}$ through the source-follower CMOS 255.

CMOS device 255 is a source follower PMOS device to CMOS device 240. At node 910 the bias voltage $V_{DD}-V_{TP}$ is provided. This bias voltage is arrived at by the following. CMOS device 245, which is a PMOS device, drops the voltage $V_{DD}-V_{TP}$ at node 915. CMOS device 250, also a PMOS device, establishes the voltage $V_{DD}-2V_{TP}$ at node 920. CMOS devices 260, 265, 270 act as leaker devices, equivalent to resistor leaker devices.

CMOS devices 275 and 280 are connected as capacitors to stabilize the bias voltages against noise injected into the bias-voltages due to Miller coupling across two devices. CMOS devices 275 and 280 have their respective source and drains connected and act as capacitors. As "capacitors" CMOS devices 275 and 280 act as filters to stabilize voltage. The use of CMOS devices allows for a very thin dielectric which in turns provides for a greater capacitance while minimizing area of the capacitor.

MOS device 800 is used turn off the clamping on the over voltage if so desired by a user. When gate 810 is activated high, the upper stage of the clamping and termination circuit is turned off and over voltage clamping is not allowed. Similarly, MOS device 820 is used to turn off the clamping on the under voltage. When gate 830 is activated high, the lower stage of the clamping and termination circuit is turned off and under voltage clamping is not allowed.

Figure 8:
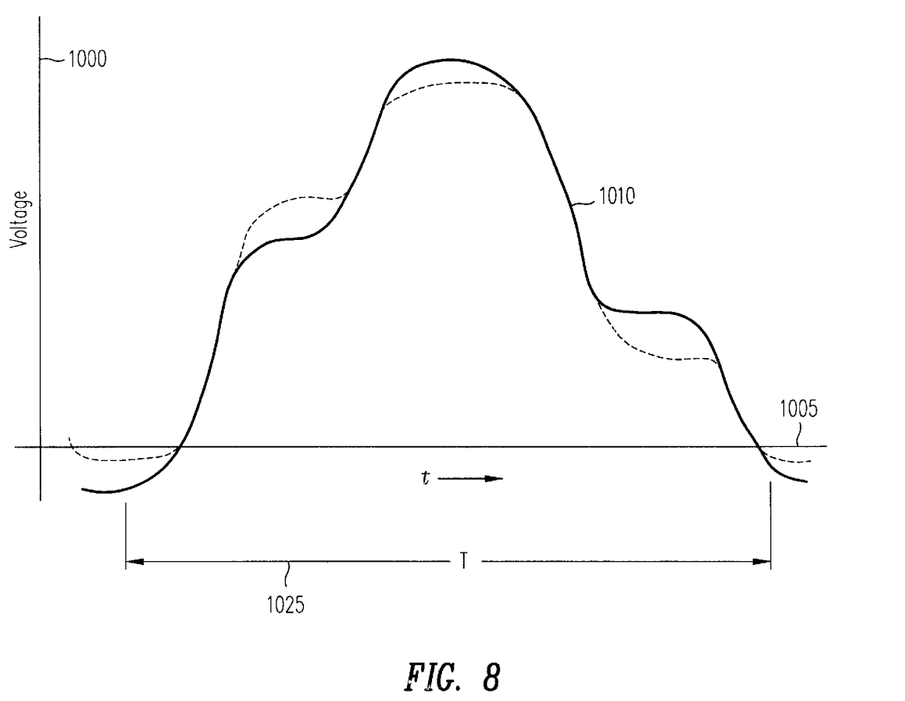
FIG. 8 illustrates received unclamped and clamped waveforms at a memory device.

Now referring to FIG. 8 illustrated are waveforms that are seen at a SRAM or referring back to FIG. 1, the memory 15. The waveform is plotted with voltage 1000 versus time 1005. A unclamped and un-terminated waveform is seen as solid line curve 1010. One period "T" 1025 of the waveform is illustrated. A significant amount of noise or ISI is seen at memory 15 because of the excessive peaks and troughs of the waveform. It is therefore necessary to adjust these highs and lows to reflect a corrected waveform. With a dynamic clamp and terminating circuit that is placed near the data buffer 20, the waveform is adjusted to reflect dotted line curve 1020. Curve 1020 follows curve 1010, except for the dotted portions illustrated in FIG. 8. The dotted portions illustrate the adjustments that are made the dynamic clamp and terminating circuit in place. Curve 1020 reflects the true signal waveform that is to be received at the memory 15.

Figure 9:
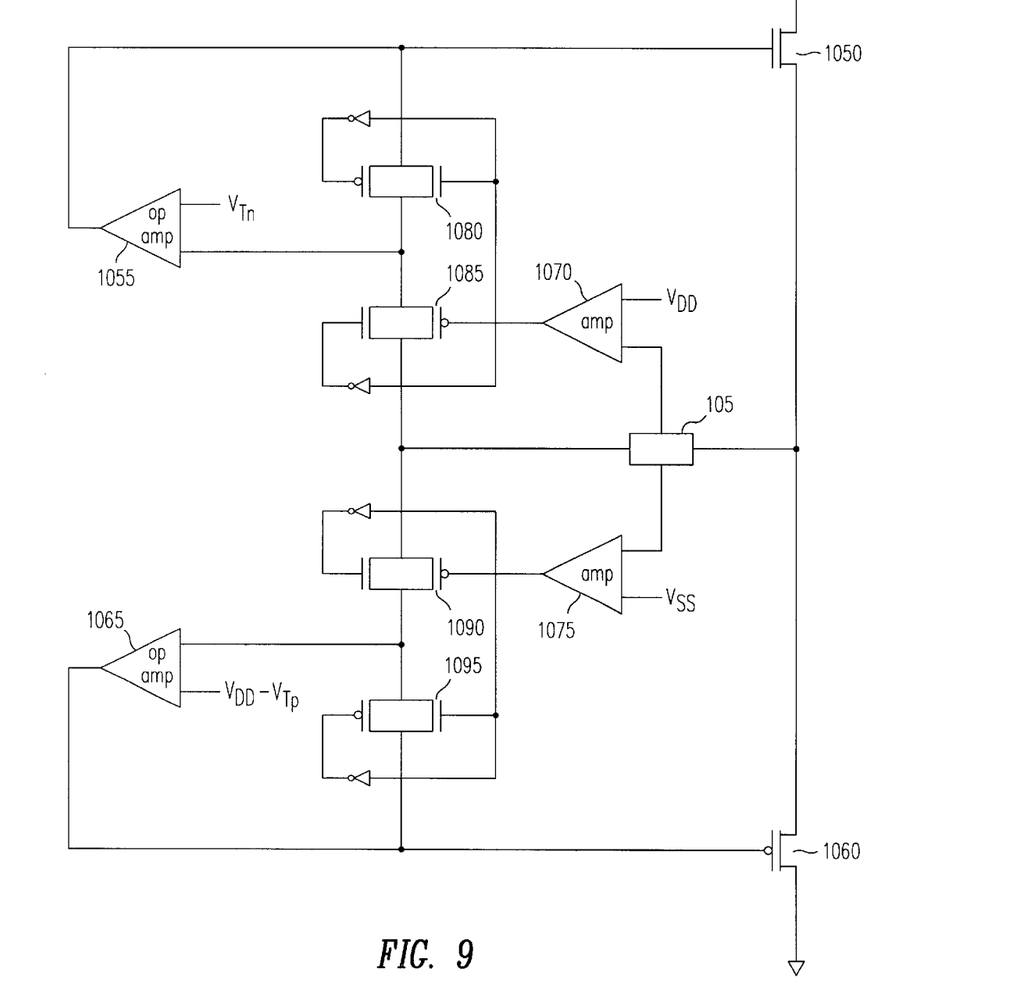
FIG. 9 illustrates a MOS type dynamic clamping and terminating circuit that makes use of operational amplifiers to bias voltage.

Alternative biasing schemes may also be used MOS type dynamic clamping and terminating circuits. Feedback devices such as operational amplifiers can be used. Now referring to FIG. 9 illustrated is a MOS type dynamic clamping and terminating circuit that makes use of operational amplifiers to bias voltage at the respective MOS devices that clamp voltage. MOS device 1050 clamps is connected to a bus via input/output pad 105. Device 105 clamps voltage if voltage overshoots $V_{DD}$. Likewise MOS device 1060 clamps voltage on the under shoot if voltage falls below $V_{SS}$ or in this particular case 0 volts.

Comparator 1070 is connected to the pad 105 to check for over shoots over $V_{DD}$, turning on switch 1085 and turning off switch 1080 when an overshoot is seen. Bias voltage $V_{DD}-V_{TP}$ is provided to MOS device 1050 by operational amplifier 1055 to assure clamping when $V_{DD}$ is exceeded.

In a similar fashion comparator 1075 is connected to pad 105 and checks for undershoots to $V_{SS}$, turning on switch 1090 and turning off switch 1095 on an undershoot. Bias voltage $V_{TN}$ is provided to MOS device 1060 by operational amplifier 1065 to assure clamping when voltage on the bus goes below $V_{SS}$.

Although the present invention has been described in connection with several embodiments, the invention is not intended to be limited to the specific forms set forth herein, but on the contrary, it is intended to cover such alternatives, modifications, and equivalents as can be reasonably included within the spirit and scope of the invention as defined by the appended claims.

What is claimed is:

1. An active clamping and terminating circuit in a communication system connected to a bus comprising:
   a first MOS transistor comprised of
   a source,
   a drain, and
   a gate, whereby the drain of the first MOS transistor is connected to the bus;
   a second MOS transistor comprised of
   a source,
   a drain, and
   a gate, whereby the source of the second MOS transistor is connected to the bus;
   a first circuit stage providing a bias voltage of $V_{TN}$ to the gate of the first MOS transistor comprised of
   a third MOS transistor comprised of
   a source,
   a drain, and
   a gate, whereby the drain of the third MOS transistor is connected to the gate of the first MOS transistor, the source of the third MOS transistor is connected to $V_{DD}$;

a fourth MOS transistor comprised of
  a source,
  a drain, and
  a gate, whereby the gate and the source of the fourth MOS transistor is connected to the gate of the third MOS transistor;
a fifth MOS transistor comprised of
  a source,
  a drain, and
  a gate, whereby the gate and the source of the fifth MOS transistor is connected to the drain of the fourth MOS transistor, the drain of the fifth MOS transistor is connected to ground;
a first resistor with one end connected to the source of the fourth MOS transistor, the other end connected to $V_{DD}$, and
a second resistor with one end connected to ground and the other end connected to the drain of the third MOS transistor and the gate of the first MOS transistor; and
a second circuit stage providing a bias voltage of $V_{DD}-V_{TP}$ to the gate of the second MOS transistor
wherein the first MOS transistor clamps and terminates voltage when voltage along the bus falls below $V_{SS}$, and the second MOS transistor clamps and terminates voltage when voltage along the bus exceeds $V_{DD}$.

2. The active clamping and terminating circuit of claim 1 wherein the first MOS transistor is a NMOS device and the second MOS transistor is a PMOS device.

3. The active clamping and terminating circuit of claim 1 wherein the source of the first MOS device is connected to $V_{DD}$, and the drain of the second MOS device is connected to ground.

4. The active clamping and terminating circuit of claim 1 wherein the third MOS transistor, the fourth MOS transistor, and the fifth MOS transistor are NMOS transistors.

5. The active clamping and terminating circuit of claim 4 wherein the first MOS transistor is a NMOS device and the second MOS transistor is a PMOS device.

6. The active clamping and terminating circuit of claim 4 wherein the source of the first MOS device is connected to $V_{DD}$, and the drain of the second MOS device is connected to ground.

7. An active clamping and terminating circuit in a communication system connected to a bus comprising:
  a first MOS transistor comprised of
    a source,
    a drain, and
    a gate, whereby the drain of the first MOS transistor is connected to the bus;
  a second MOS transistor comprised of
    a source,
    a drain, and
    a gate, whereby the source of the second MOS transistor is connected to the bus;
  a first circuit stage providing a bias voltage of $V_{TN}$ to the gate of the first MOS transistor; and
  a second circuit stage providing a bias voltage of $V_{DD}-V_{TP}$ to the gate of the second MOS transistor comprised of
    a sixth MOS transistor comprised of
      a source,
      a drain, and
      a gate, whereby the source of the sixth MOS transistor is connected to the gate of the second MOS transistor, the drain of the third MOS transistor is connected to ground;
    a seventh MOS transistor comprised of
      a source,
      a drain, and
      a gate, whereby the gate and the drain of the seventh MOS transistor is connected to the gate of the sixth MOS transistor;
    an eighth MOS transistor comprised of
      a source,
      a drain, and
      a gate, whereby the gate and the drain of the eighth MOS transistor is connected to the source of the seventh MOS transistor, the source of the eighth MOS transistor is connected to $V_{DD}$;
    a third resistor with one end connected to the drain of the seventh MOS transistor, the other end connected to ground, and
    a fourth resistor with one end connected to $V_{DD}$ and the other end connected to the source of the sixth MOS transistor and the gate of the second MOS transistor;
  wherein the first MOS transistor clamps and terminates voltage when voltage along the bus falls below $V_{SS}$, and the second MOS transistor clamps and terminates voltage when voltage along the bus exceeds $V_{DD}$.

8. The active clamping and terminating circuit of claim 7 wherein the first MOS transistor is a NMOS device and the second MOS transistor is a PMOS device.

9. The active clamping and terminating circuit of claim 7 wherein the source of the first MOS device is connected to $V_{DD}$, and the drain of the second MOS device is connected to ground.

10. The active clamping and terminating circuit of claim 7 wherein the sixth MOS transistor, the seventh MOS transistor, and the eighth MOS transistor are PMOS transistors.

11. The active clamping and terminating circuit of claim 1 wherein the first circuit stage comprises:
  a third MOS transistor comprised of
    a source,
    a drain, and
    a gate, wherein the drain of the third MOS transistor is connected to the gate of the first MOS transistor, the source of the third MOS transistor is connected to $V_{DD}$;
  a fourth MOS transistor comprised of
    a source,
    a drain, and
    a gate, wherein the gate and the source of the fourth MOS transistor is connected to the gate of the third MOS transistor;
  a fifth MOS transistor comprised of
    a source,
    a drain, and
    a gate, wherein the gate and the source of the fifth MOS transistor is connected to the drain of the fourth MOS transistor, the drain of the fifth MOS transistor is connected to ground;
  a first resistor with one end connected to the source of the fourth MOS transistor, the other end connected to $V_{DD}$,
  a second resistor with one end connected to ground and the other end connected to the drain of the third MOS transistor and the gate of the first MOS transistor,
the second circuit stage comprises:
  a sixth MOS transistor comprised of
    a source,
    a drain, and
    a gate, wherein the source of the sixth MOS transistor is connected to the gate of the second MOS transistor, the drain of the third MOS transistor is connected to ground;

a seventh MOS transistor comprised of
 a source,
 a drain, and
 a gate, wherein the gate and the drain of the seventh MOS transistor is connected to the gate of the sixth MOS transistor;

an eighth MOS transistor comprised of
 a source,
 a drain, and
 a gate, wherein the gate and the drain of the eighth MOS transistor is connected to the source of the seventh MOS transistor, the source of the eighth MOS transistor is connected to $V_{DD}$;

a third resistor with one end connected to the drain of the seventh MOS transistor, the other end connected to ground, and a fourth resistor with one end connected to $V_{DD}$ and the other end connected to the source of the sixth MOS transistor and the gate of the second MOS transistor.

12. The active clamping and terminating circuit of claim 11 wherein the third MOS transistor, the fourth MOS transistor, and the fifth MOS transistor are NMOS transistors, and the sixth MOS transistor, the seventh MOS transistor, and the eighth MOS transistor are PMOS transistors.

\* \* \* \* \*